(12) United States Patent
Lin

(10) Patent No.: US 7,459,790 B2
(45) Date of Patent: *Dec. 2, 2008

(54) POST PASSIVATION INTERCONNECTION SCHEMES ON TOP OF THE IC CHIPS

(75) Inventor: Mou-Shiung Lin, Hsin-Chu (TW)

(73) Assignee: Megica Corporation, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/788,221

(22) Filed: Apr. 19, 2007

(65) Prior Publication Data
US 2007/0200244 A1 Aug. 30, 2007

Related U.S. Application Data

(63) Continuation of application No. 10/685,872, filed on Oct. 15, 2003, now Pat. No. 7,230,340.

(51) Int. Cl.
*H01L 23/48* (2006.01)
(52) U.S. Cl. .................. 257/773; 257/690; 257/700; 257/774; 257/E21.575
(58) Field of Classification Search ............... 257/690, 257/700, 691, 773, 774, E21.575; 438/614–616, 438/622, 631, 637, 638, 107, 110, 624
See application file for complete search history.

(56) References Cited

U.S. PATENT DOCUMENTS

| | | | |
|---|---|---|---|
| 4,423,547 A | 1/1984 | Farrar et al. | |
| 4,618,878 A | 10/1986 | Aoyama et al. | |
| 5,083,187 A | 1/1992 | Lamson et al. | |
| 5,108,950 A | 4/1992 | Wakabayashi et al. | |
| 5,227,012 A | 7/1993 | Brandli et al. | |
| 5,384,488 A | 1/1995 | Golshan et al. | |
| 5,416,356 A | 5/1995 | Staudinger et al. | |
| 5,468,984 A | 11/1995 | Efland et al. | |
| 5,478,773 A | 12/1995 | Dow et al. | |
| 5,659,201 A | 8/1997 | Wollesen | |
| 5,665,639 A | 9/1997 | Seppala et al. | |
| 5,789,303 A | 8/1998 | Leung et al. | |

(Continued)

OTHER PUBLICATIONS

*Multichip Module Technologies and Alternatives: the Basics*, edited by Daryl Ann Dorne and Paul D. Franzon, Copyright 1993 by Van Nostrand Reinhold, pp. 755 & 757.

(Continued)

*Primary Examiner*—Kevin M Picardat
(74) *Attorney, Agent, or Firm*—Saile Ackerman LLC; Stephen B. Ackerman; Rosemary L. S. Pike

(57) ABSTRACT

A new method is provided for the creation of interconnect lines. Fine line interconnects are provided in a first layer of dielectric overlying semiconductor circuits that have been created in or on the surface of a substrate. A layer of passivation is deposited over the layer of dielectric, a thick second layer of dielectric is created over the surface of the layer of passivation. Thick and wide interconnect lines are created in the thick second layer of dielectric. The first layer of dielectric may also be eliminated, creating the wide thick interconnect network on the surface of the layer of passivation that has been deposited over the surface of a substrate.

28 Claims, 9 Drawing Sheets

U.S. PATENT DOCUMENTS

| | | | |
|---|---|---|---|
| 5,834,844 | A | 11/1998 | Akagawa et al. |
| 5,854,513 | A | 12/1998 | Kim |
| 5,929,508 | A | 7/1999 | Delgado et al. |
| 5,969,424 | A | 10/1999 | Matsuki et al. |
| 6,020,640 | A | 2/2000 | Efland et al. |
| 6,030,877 | A | 2/2000 | Lee et al. |
| 6,103,552 | A | 8/2000 | Lin |
| 6,144,100 | A | 11/2000 | Shen et al. |
| 6,146,958 | A | 11/2000 | Zhao et al. |
| 6,159,773 | A | 12/2000 | Lin |
| 6,184,143 | B1 | 2/2001 | Ohashi et al. |
| 6,187,680 | B1 | 2/2001 | Costrini et al. |
| 6,200,888 | B1 | 3/2001 | Ito et al. |
| 6,229,221 | B1 | 5/2001 | Kloen et al. |
| 6,232,147 | B1 | 5/2001 | Matsuki et al. |
| 6,236,101 | B1 | 5/2001 | Erdeljac et al. |
| 6,272,736 | B1 | 8/2001 | Lee |
| 6,303,423 | B1 | 10/2001 | Lin |
| 6,383,916 | B1 | 5/2002 | Lin |
| 6,455,885 | B1 | 9/2002 | Lin |
| 6,459,135 | B1 | 10/2002 | Basteres et al. |
| 6,465,879 | B1 | 10/2002 | Taguchi |
| 6,472,745 | B1 | 10/2002 | Iizuka |
| 6,495,442 | B1 | 12/2002 | Lin et al. |
| 6,501,169 | B1 | 12/2002 | Aoki et al. |
| 6,544,880 | B1 | 4/2003 | Akram |
| 6,545,354 | B1 | 4/2003 | Aoki et al. |
| 6,560,862 | B1 | 5/2003 | Chen et al. |
| 6,605,528 | B1 | 8/2003 | Lin et al. |
| 6,636,139 | B2 | 10/2003 | Tsai et al. |
| 6,649,509 | B1 | 11/2003 | Lin et al. |
| 7,271,489 | B2 * | 9/2007 | Lin et al. .................... 257/773 |
| 2001/0035452 | A1 | 11/2001 | Test et al. |
| 2002/0017730 | A1 | 2/2002 | Tahara et al. |
| 2002/0109232 | A1 | 8/2002 | Lin et al. |
| 2002/0115282 | A1 | 8/2002 | Lin et al. |
| 2002/0158334 | A1 | 10/2002 | Vu et al. |
| 2003/0102551 | A1 | 6/2003 | Kikuchi |
| 2003/0222295 | A1 | 12/2003 | Lin |

OTHER PUBLICATIONS

Co-pending U.S. Appl. No. 10/154,662, filed May 24,2002, Top Layers of Metal for High Performance IC's, Assigned to the Same Assignees.

* cited by examiner

POST PASSIVATION INTERCONNECTION SCHEMES ON TOP OF THE IC CHIPS

This is a continuation of application Ser. No. 10/685,872, filed on Oct. 15, 2003, now Pat. No. 7,230,340.

BACKGROUND OF THE INVENTION (1) Field of the Invention

The invention relates to the fabrication of integrated circuit devices, and more particularly, to a method of post-passivation processing for the creation of conductive interconnects.

(2) Description of the Prior Art

Improvements in semiconductor device performance are typically obtained by scaling down the geometric dimensions of the Integrated Circuits; this results in a decrease in the cost per die while at the same time some aspects of semiconductor device performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, one approach has been to develop low resistance metal (such as copper) for the wires while low-k dielectric materials are used in between signal lines. Current practice is to create metal interconnection networks under a layer of passivation. This approach, however, limits the interconnect network to fine line interconnects and the therewith associated high parasitic capacitance and high line resistivity. The latter two parameters, because of their relatively high values, degrade circuit performance, an effect which becomes even more severe for higher frequency applications and for long interconnect lines that are, for instance, used for clock distribution lines. Also, fine line interconnect metal cannot carry high values of current that is typically needed for ground busses and for power busses.

It has previously been stated that it is of interest to the semiconductor art to provide a method of creating interconnect lines that removes typical limitations that are imposed on the interconnect wires, such as unwanted parasitic capacitances and high interconnect line resistivity. U.S. Pat. No. 6,383,916 to the same assignee as the present invention provides such a method. An analogy can be drawn in this respect whereby the currently (prior art) used fine-line interconnection schemes, which are created under a layer of passivation, are the streets in a city; in the post-passivation interconnection scheme of the above patent, the interconnections that are created above a layer of passivation can be considered the freeways between cities.

FIG. 1 shows a diagram of a silicon substrate on the surface of which has been created a conductive interconnect network. The structure that is shown in FIG. 1 addresses prior art power and ground distribution networks. The various features that have been highlighted in FIG. 1 are the following:

40, a silicon substrate on the surface of which has been created an interconnect network 42, a sample number of semiconductor circuits that have been created in or on the surface of the substrate 40

44, two electrostatic discharge (ESD) circuits created in or on the surface of the substrate 40; one ESD circuit is provided for each pad that is accessible for external connections (pads 52, see below)

46 is a layer of interconnect lines; these interconnect lines are above the surface of substrate 40 and under the layer 48 of passivation and represent a typical application of prior art fine-line interconnects; these fine-line interconnects of layer 46 typically have high resistivity and high parasitic capacitance.

48 is a layer of passivation that is deposited over the surface of the layer 46 of interconnect lines. The passivation layer is the final layer of the IC process in the prior art. The passivation layer is used to protect the underlying devices and fine-line interconnection from damage by mobile ions, moisture, transition metals, and contamination.

50 is a power or ground bus that connects to the circuits 42 via fine-line interconnect lines provided in layer 46; this power or ground bus is typically of wider metal since this power or ground bus carries the accumulated current or ground connection for the devices 42. The power, groun buses are built in the fine line interconnect under the passivation layer. The fine line interconnection can be in one layer or more than one layer of metals.

52 is a power or ground pad that passes through the layer 48 of passivation and that has been connected to the power or ground bus 50.

From the above the following can be summarized: circuits are created in or on the surface of a silicon substrate, interconnect lines are created for these circuits for further interconnection to external circuitry, the circuits are, on a per I/O pad basis, provided with an ESD circuit; these circuits with their ESD circuit are connected to a power or ground pad that penetrates a layer of passivation. The layer of passivation is the final layer that overlies the created interconnect line structure; the interconnect lines underneath the layer of passivation are fine line interconnects and have all the electrical disadvantages of fine line interconnects such as high resistivity and high parasitic capacitance.

Relating to the diagram that is shown in FIG. 1, the following comment applies: ESD circuits are, as is known in the art, provided for the protection of semiconductor circuits against unwanted electrostatic discharge. For this reason, each pad that connects a semiconductor circuit to the external circuits must be provided with an ESD circuit.

FIG. 2 shows a diagram of a prior art configuration that resembles the diagram shown in FIG. 1. The structure that is shown in FIG. 2 however relates to clock and signal distribution networks. FIG. 2 shows in addition (to the previously highlighted aspects of FIG. 1):

45 are two ESD circuits that are provided in or on the surface of the substrate 40; ESD circuits are always required for any external connection to an input/output (I/O) pad.

45' which are circuits that can be receiver or driver or I/O circuits for input (receiver) or output (driver) or I/O purposes respectively.

54 is a clock, signal, address, or data bus built in the fine line interconnection metal under the passivation layer. The clock, signal, or buses can be in one layer or in more than one layer of fine line interconnect metals.

56 is a clock or signal pad that has been extended through the layer 48 of passivation.

The same comments apply to the diagram that is shown in FIG. 2 as previously have been made with respect to FIG. 1, with as a summary statement that the layer of passivation is the final layer that overlies the created structure, the interconnect lines underneath the layer of passivation are fine line interconnects and have all the electrical disadvantages of fine line interconnects such as high resistivity and high parasitic capacitance.

Further with respect to FIG. 2 where pads 56 are signal or clock pads:

pads 56 must be connected to ESD and driver/receiver or I/O circuits 45 for signal or clock pads 56, these pads must be connected not only to ESD circuits but also to driver or receiver or I/O circuits, highlighted as circuit 45' in FIG. 2 after (clock and signal) stimuli have passed through the ESD and driver/receiver or I/O circuits, these stimuli are further routed using, under prior art methods, fine-line interconnect wires. A layer of passivation is deposited over the dielectric layer in which the interconnect network has been created.

It is therefore of interest to the semiconductor art to provide a method of creating interconnect lines that removes typical limitations that are imposed on the interconnect wires, such as unwanted parasitic capacitances and high interconnect line resistivity. The present invention is related to U.S. Pat. No. 6,303,423, to the same assignee as the present invention.

SUMMARY OF THE INVENTION

A principal objective of the invention is to provide a method for the creation of interconnect metal that allows for the use of thick and wide metal.

Another objective of the invention is to provide a method for the creation of interconnect metal that uses the application of a thick layer of dielectric such as polymer.

Yet another objective of the invention is to provide a method that allows for the creation of long interconnect lines, whereby these long interconnect lines do not have high resistance or introduce high parasitic capacitance.

A still further objective of the invention is to create interconnect lines that can carry high levels of current for the creation of power and ground distribution networks.

A still further objective of the invention is to create interconnect metal that can be created using cost effective methods of manufacturing by creating the interconnect metal on the surface of and after a layer of passivation has been deposited.

In accordance with the objectives of the invention a new method is provided for the creation of interconnect lines. Fine line interconnects are provided in a first layer of dielectric overlying semiconductor circuits that have been created in or on the surface of a substrate. A layer of passivation is deposited over the layer of dielectric; a thick second layer of dielectric is created over the surface of the layer of passivation. Thick and wide interconnect lines are created in the thick second layer of dielectric. Intra-chip drivers are connected to the thick, wide post-passivation interconnections.

DESCRIPTION OF THE PREFERRED EMBODIMENTS

U.S. Pat. No. 6,383,916 teaches an Integrated Circuit structure where re-distribution and interconnect metal layers are created in layers of dielectric over the passivation layer of a conventional Integrated Circuit (IC). A layer of passivation is deposited over the IC, a thick layer of polymer is alternately deposited over the surface of the layer of passivation, and thick, wide metal lines are formed over the passivation.

Figure 6A:
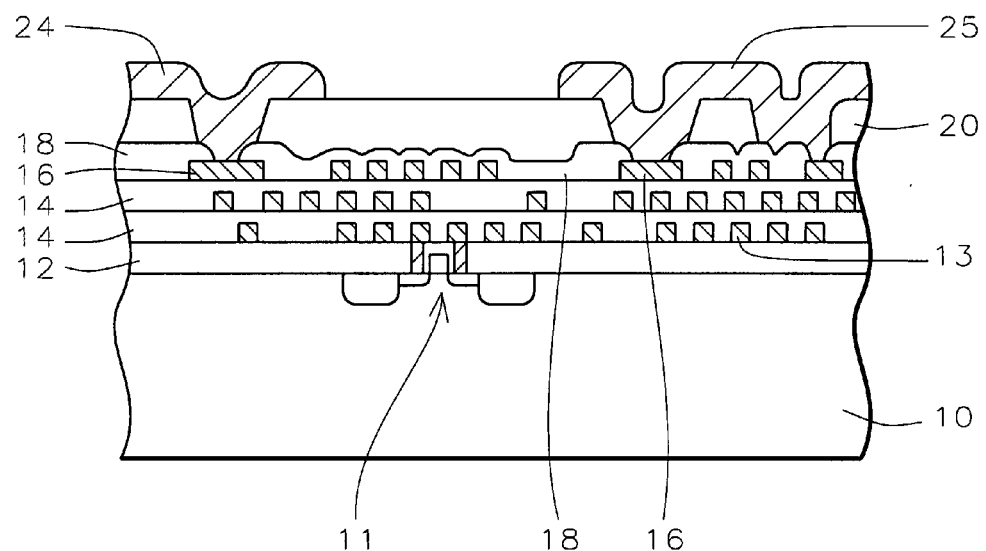
FIGS. 6a and 6b are representations of the interconnect structure of the present invention.

Referring now more specifically to FIG. 6a, there is shown a cross section of one implementation of U.S. Pat. No. 6,383,916. The surface of silicon substrate 10 has been provided with transistors 11 and other devices (not shown in FIG. 6a). The surface of substrate 10 is covered by an interlevel dielectric (ILD) layer 12, formed over the devices.

Layers 14 (two examples are shown) represent all of the metal layers and dielectric layers that are typically created on the dielectric layer 12. Layers 14 contain multiple layers of dielectric or insulation and the like; conductive interconnect lines 13 make up the network of electrical connections that are created throughout layers 14. Overlying and on the surface of layers 14 are points 16 of electrical contact. These points 16 of electrical contact can, for instance, be bond pads that establish electrical interconnects to external circuits. These points of contact 16 can be points of interconnect within the IC arrangement that establish electrical interconnects to the transistors and other devices in the surface of the substrate. A passivation layer 18, formed of, for example, a composite layer of silicon oxide and silicon nitride (the thickness of silicon nitride is usually thicker than 0.4 μm for the passivation purpose), is deposited over the surface of layers 14, and functions to prevent the penetration of mobile ions (such as sodium ions), moisture, transition metals (such as gold, copper, silver), and other contamination. The passivation layer is used to protect the underlying devices (such as transistors, polysilicon resistors, poly-to-poly capacitors, etc.) and the fine-line metal interconnection.

The key steps of U.S. Pat. No. 6,383,916 begin with the deposition of a thick layer 20 of a polymer, preferably polyimide, that is deposited over the surface of passivation layer 18. Access must be provided to points of electrical contact 16; for this reason a pattern of openings is formed through the polyimide layer 20 and the passivation layer 18. Contact points 16 are, by means of the openings that are created in the layer 20 of polyimide, electrically extended to the surface of layer 20.

After formation of the openings, metallization is performed to create patterned wide metal layers 24 and 25 and to connect to contact points 16. Lines 24 and 25 can be of any design in width and thickness to accommodate specific circuit design requirements. This structure allows for the interconnection of circuit elements at various distances using the thick, wide (as compared to the underlying "fine line" metallization in layers 14) metal of 25. Thick, wide metal 25 has smaller resistance and capacitance than the fine line metal 14 and is also easier and more cost effective to manufacture. The thick, wide metals, usually formed by photoresist defined electroplating, are electroplated metals. Gold and copper are preferred. Optionally, a layer of polymer (not shown in FIG. 6a) can also be formed to encapsulate the thick, wide metal 25.

Figure 6B:
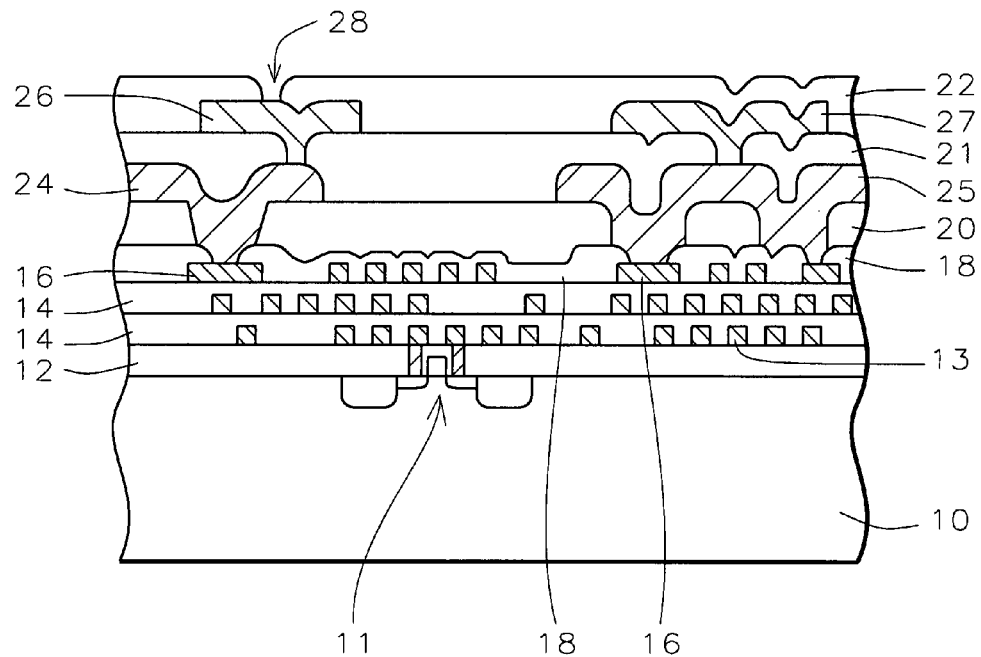

Referring now to FIG. 6b, multiple layers of post-passivation metals can also be built for some applications. A second layer of polymer 21 is deposited and patterned, followed by the formation of the second layer of thick, wide metal 26, 27. Co-pending U.S. patent application Ser. No. 10/154,662, filed on May 24, 2002, and herein incorporated by reference, provides details of the formation of the metal layers. A final encapsulation 22 covers the whole wafer with some exposed pads 28 for connection to external circuits.

Figure 6C:
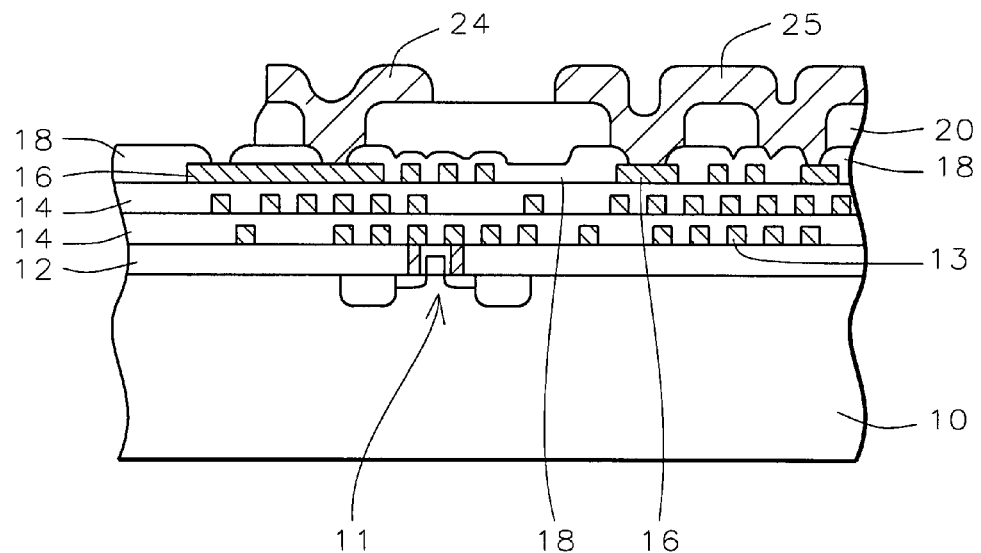
FIGS. 6c and 6d are representations of the interconnect structure of the present invention including wirebonding.
Figure 6D:
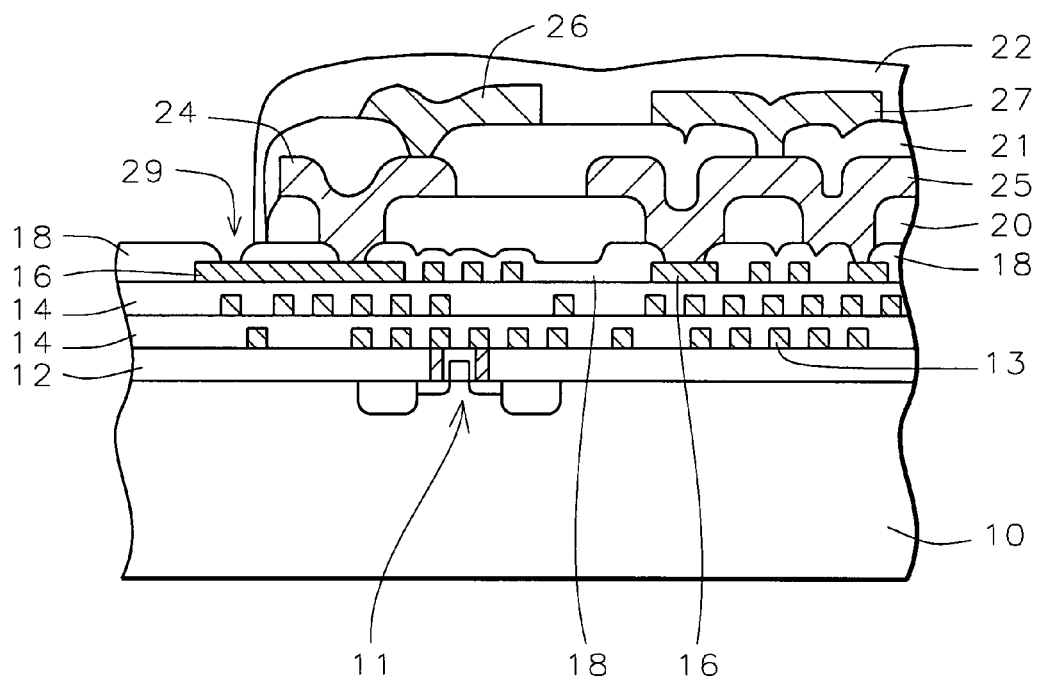

FIGS. 6c and 6d are analogous to FIGS. 6a and 6b, respectively, but show the process of the invention in conjunction with wirebonding. Openings 29 have been made to aluminum pad 16. Conventional wirebonding techniques may be use to form wirebond connections to the original Aluminum pad 16 exposed by openings 29 in FIGS. 6c and 6d. Here, a piece of aluminum or damascene copper is used for a short distance interconnection between wirebonding pads and the post-passivation interconnection.

The following comments relate to the size and the number of the contact points 16 in FIGS. 6a-6d. Because these contact points 16 are located on top of a thin dielectric (layer 14, FIGS. 6a-6d) the pad size cannot be too large since a large pad size brings with it a large capacitance. In addition, a large pad size will interfere with the routing capability of that layer of metal. It is therefore preferred to keep the size of the pad 16 relatively small. The size of the contact pad 16 can be in the order of 0.5 μm to 40 μm, the exact size being dependent on the electrical requirements of the contacts.

The referenced application does not impose a limitation on the number of contact pads that can be included in the design; this number is not only dependent on package design requirements but is mostly dependent on the internal circuit design requirements. Layer 18 in FIGS. 6a-6d can be a typical IC passivation layer.

The most frequently used passivation layer in the present state of the art is plasma enhanced CVD (PECVD) oxide and nitride. In creating layer 18 of passivation, a layer of approximately 0.5 μm PECVD oxide can be deposited first followed by a layer of approximately more than 0.4 μm nitride. Passivation layer 18 is very important because it protects the device wafer from moisture and foreign ion contamination. To achieve the passivation purpose, the silicon nitride is usually thicker than 0.4 μm. The positioning of this layer between the sub-micron process (of the integrated circuit) and the tens-micron process (of the interconnecting metalization structure) is of critical importance since it allows for a cheaper process that possibly has less stringent clean room requirements for the process of creating the interconnecting metalization structure.

Layers 20, 21, and 22 are a thick polymer dielectric layer (for example polyimide) that have a thickness in excess of 2 μm (after curing). The range of the polymer thickness can vary from 2 μm to 150 μm, dependent on electrical design requirements.

For the deposition of layers 20, 21, 22 the Hitachi-Dupont polyimide HD 2732 or 2734 or Asahi polyimide LS800, I-83005, or 8124, can, for example, be used. The polyimide can be spin-on coated and cured. After spin-on coating, the polyimide will be cured at 370 degrees C. for 1 hour in a vacuum or nitrogen ambient. For thicker polyimide, the polyimide film can be multiple coated and cured. The polyimide also can be formed by screen printing.

Another material that can be used to create layers 20, 21, 22 is the polymer benzocyclobutene (BCB). This polymer is at this time commercially produced by for instance Dow Chemical and has recently gained acceptance to be used instead of typical polyimide application.

The thick layers 20, 21, 22 of polymer can be coated in liquid form on the surface of the layer 18 of passivation or it can be laminated over the surface of layer 18 or passivation by dry film application.

Additional electrical components such as an inductor, a capacitor, and the like, not shown, can be created on the surface of layer 20 or 22 of polyimide and in electrical contact with underlying metallization.

Figure 1:
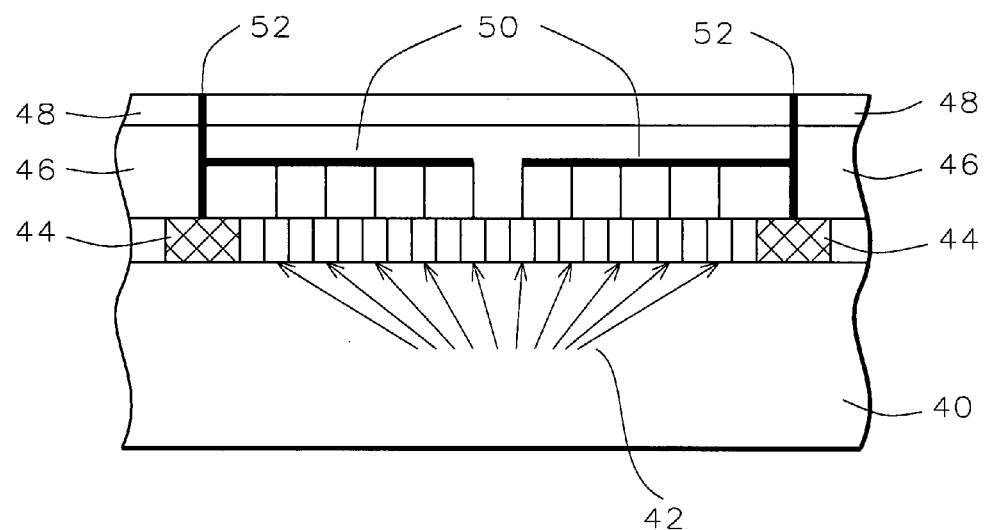
FIG. 1 is a representation of a silicon substrate over which a prior art fine-line interconnect network is created over which a layer of passivation is deposited, and power and/or ground pads are provided through the layer of passivation for external connection. The structure that is shown in FIG. 1 addresses prior art power and ground distribution networks.
Figure 2:
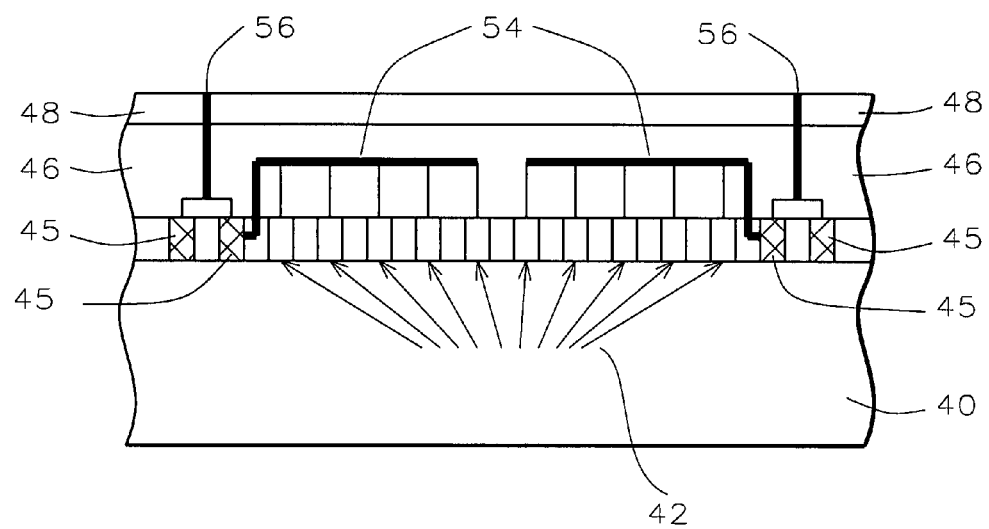
FIG. 2 is a representation of a silicon substrate over which a prior art fine-line interconnect network is created over which a layer of passivation is deposited, and clock and/or signal pads are provided through the layer of passivation for external connection. The structure that is shown in FIG. 2 addresses prior art clock and signal distribution networks.
Figure 3A:
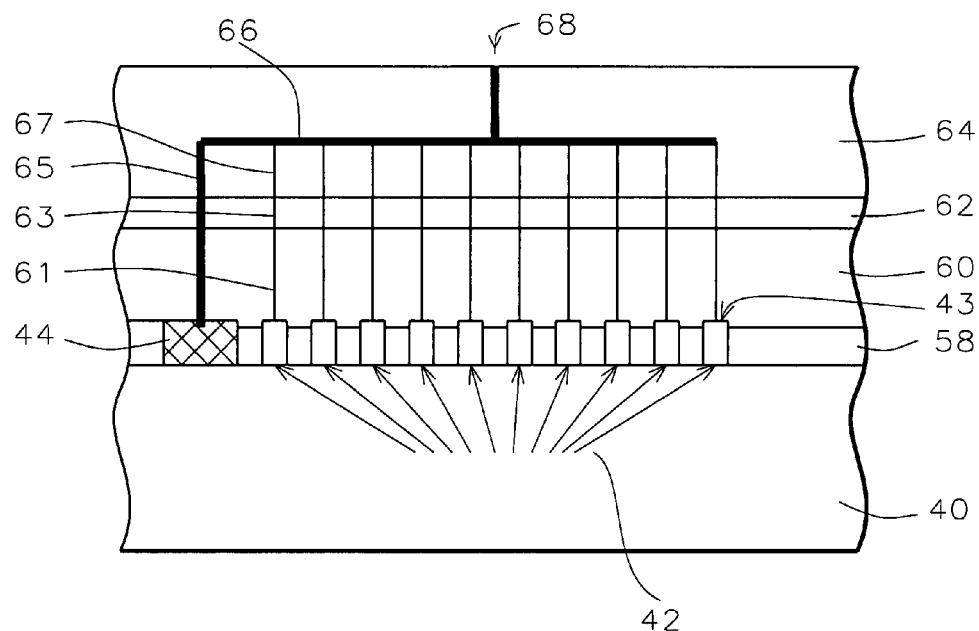
FIG. 3a is a representation of a silicon substrate over which an interconnect network is created according to the invention. Power and/or ground pads are provided for external connection. The structure that is shown in FIGS. 3a and 3b relates to power and ground distribution networks of the invention. 66 represents one or more than one layer of metal.

Now, the process of the present invention will be described in detail. Referring now specifically to FIG. 3a, this figure refers to power and ground architecture. There is shown in FIG. 3a a silicon substrate 40 over which an interconnect network is created according to the invention, with a wide and thick wire interconnect network created in a thick layer of dielectric overlying a layer of passivation. A power and/or ground pad can be provided for external connection. Following are the various features that are shown in FIG. 3a:

40 is the silicon substrate on the surface of which interconnect lines are created in accordance with the invention.

42 are semiconductor circuits that are created in or on the surface of substrate 40. Each semiconductor circuit has several nodes connected to other circuits or power/ground.

43 is the power or ground node of the semiconductorcircuits 42.

44 is an ESD circuit that is provided for the protection of circuits 42.

58 is a layer including the semiconductor devices 42 that have been created in or on the surface of substrate 40.

60 are one or more dielectric layers that have been created overlying the layer 58 including the semiconductor devices 42.

61 is a connection comprising metal formed through a via through one or more dielectric layers 60; more such vias are shown in FIG. 3a but are, for reasons of simplicity, not highlighted.

62 is a layer of passivation that has been deposited overlying the layer 60.

63 is one of the vias that passes through layer 62 of passivation; more such vias are shown in FIG. 3a but are, for reasons of simplicity, not highlighted.

64 is a layer of dielectric in which, as a post-passivation process, interconnects have been created.

65 is a power or ground bus that is connected to the ESD circuit 44, originating in layer 64 and further passing through layers 62 and 60. This connection comprises metal formed through vias in the dielectric layers 62 and 60.

66 is the power or ground bus for the connection scheme in layer 64. This power or ground bus 66 could be one or more than one thick, wide metal layers in dielectric layer 64 including a polymer. For multiple layers of metal, the metals are connected through vias in the polymer.

67 is a via that is created overlying the layer 62 of passivation and in the dielectric layer 64; more such vias are shown in FIG. 3a but are, for reasons of simplicity, not highlighted.

68 is the power or ground pad for the multiple semiconductor devices 42 in layer 58.

From the representation that is shown in FIG. 3a, it is clear that, most importantly, the ability to create interconnects to semiconductor devices 42 that have been created in or on the surface of a substrate 40 has been extended by creating these interconnects not only as fine-line interconnects 61 in layer 60 but extending the interconnect by creation of a wide, thick wire interconnect network 66 overlying a layer of passivation 62. This provides immediate and significant benefits in that these lines are further removed from the surface of the substrate 40 (reducing parasitic influences by the interconnect lines on the semiconductor devices 42 that are created in or on the surface of the substrate 40) while the interconnect network 66 that is created overlying the layer of passivation 62 can now contain sturdier; that is, thicker and wider, interconnect lines. The thick, wide metal interconnects 66 can be used for power and ground distribution; this distribution then takes place above a layer of passivation 62 and partially replaces and extends the conventional method of having for these purposes a fine-line distribution interconnect network under the layer of passivation 62.

Some points of interest can be listed at this time as they relate to prior art methods and to the invention.

Prior Art:
provides an ESD circuit for each pad that is used for external input/output interconnect
provides a fine-line interconnect network for further distribution of the power and ground stimuli, and
the fine-line power and ground distribution network is created underneath a layer of passivation.

In this respect and related to the above provided comments, it must be remembered that power and ground pads do not require drivers and/or receiver circuitry.

The invention:
does not need to create an ESD circuit for each pad that is used for external input/output interconnect, in view of the more robust wiring that is connected to the ESD circuit, resulting in reduced power loss and resulting in more power being delivered to the ESD circuit, and allows for the power and ground interconnects to be directly connected to the power and ground nodes of the internal circuits of a semiconductor device, this either without an ESD circuit or with a smaller than regular ESD circuit (as previously explained).

The method that is used to create the interconnect network that is shown in FIG. 3a addresses only the use of power and ground connections. FIG. 3a can be summarized as follows: a silicon substrate 40 is provided in the surface of which there have been created semiconductor devices 42 and at least one electrostatic discharge (ESD) circuit 44; a one or more layers 60 of dielectric are deposited over the substrate 40; a fine-line interconnect network 61 is created in the dielectric layers 60 making contact with the active circuits 42 and the ESD circuit 44. A layer of passivation 62 is deposited over the fine-line interconnect network 61. Openings are created in the layer of passivation 62 that aligns with points of contact in the top layer of the fine-line interconnect network 61. A thick layer of dielectric 64 is optionally deposited over the layer of passivation 62; a wide thick line interconnect network 66 is created in the layer of dielectric 64, and connected to the ESD circuits. A point of electrical contact 68 comprising a power or ground contact is provided in the surface of the thick layer 64 of dielectric.

Figure 3B:
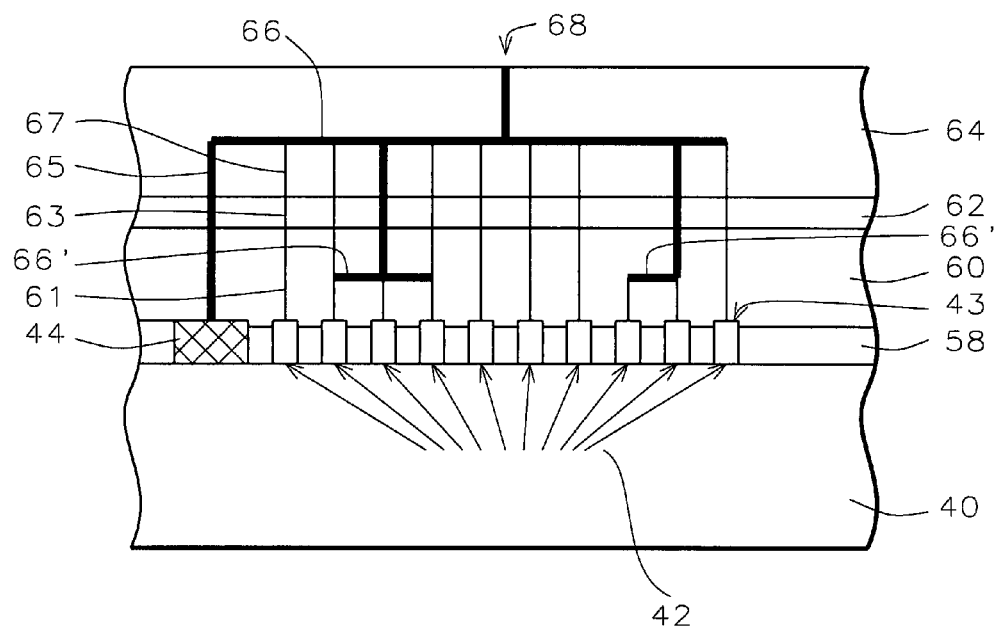
FIG. 3b further distributes the power and ground to the circuit nodes through power and ground distribution lines that are below a layer of passivation and power and ground distribution lines that are above a layer of passivation. 66 and 66' each represent one or more than one layer of metal.

FIG. 3b provides further insight into the creation of the power and ground interconnect lines of the invention whereby these interconnect lines have been shown as interconnect lines 66 and interconnect lines 66'. Interconnect lines 66 have been created above the layer 62 of passivation and act as global power and ground interconnect lines. Interconnect lines 66' have been created below the layer 62 of passivation and act as local power and ground interconnect lines.

Figure 3C:
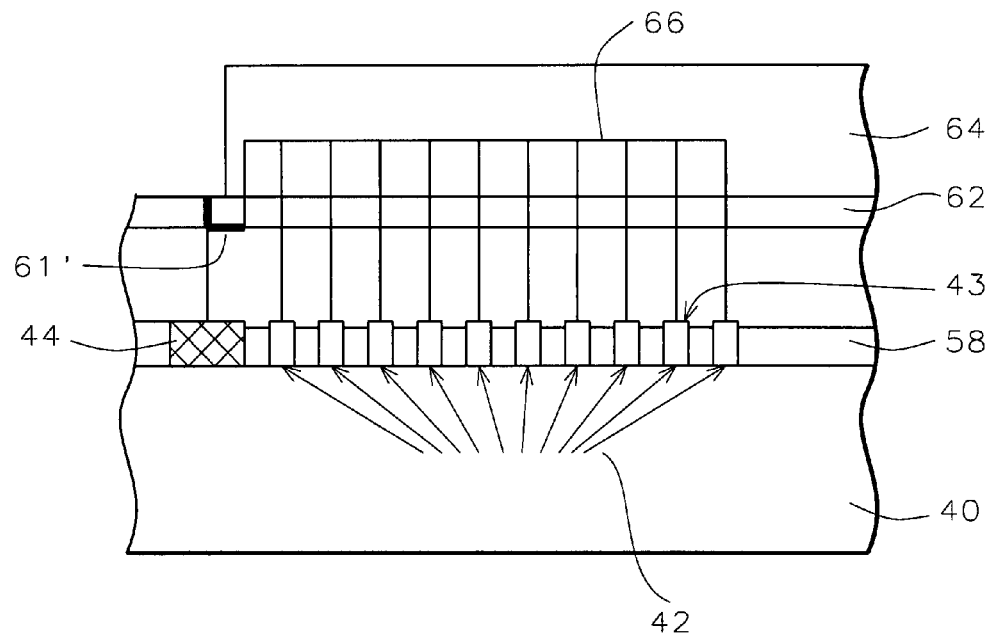
FIG. 3c shows an alternative wherein contact is made to a conventional bond pad through the passivation layer rather than through a post-passivation thick wide metal system.

FIG. 3c provides an alternative in which contact is made to a conventional aluminum metal 61', for example, through the passivation layer 62 rather than making contact to the post-passivation thick, wide metal system 66. The top layer of metal 61' is used for wirebonding purposes and for connection between wirebonding pads and the wide, thick interconnect lines 66. The distance of 61' is a short distance; for example, <500 µm in length.

In the process of the present invention, in all aspects shown in the figures, the post passivation metallization 66 can optionally be performed directly on the passivation layer 62 without the intervening polymer layer. Although the polymer layer provides distinct advantages, it may be desirable to dispense with the polymer layer in order to save costs.

Figure 4A:
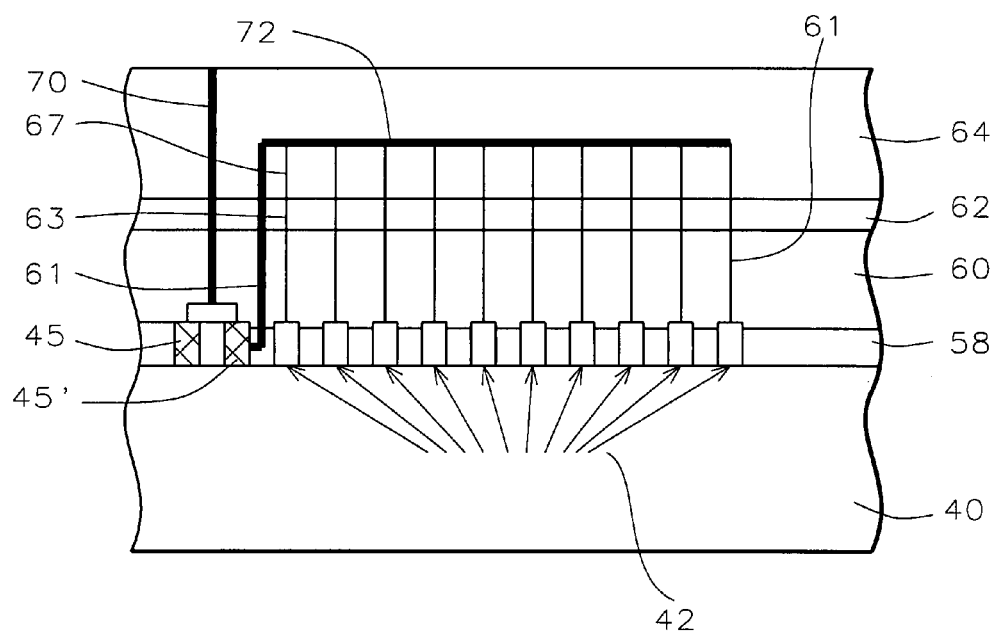
FIG. 4a is a representation of a silicon substrate over which an interconnect network is created according to the invention. An ESD and/or driver and/or receiver circuit access pad is provided through the surface of the layer of dielectric for external connection. The structure that is shown in FIGS. 4a and 4b address clock and signal distribution networks of the invention. "Signals" refer to, but are not limited to, address and data. 72 in the figure represents one or more than one layer of metal.

Referring now to FIG. 4a, FIG. 4a addresses the interconnections of signal and clock line. Signal here includes address, data, logic, and analog signals. Signal also includes the power/ground voltage output from voltage regulators. In FIG. 4a there is shown a cross section of a silicon substrate 40 over which an interconnect network 61 is created according to the invention. An access pad 70 to an ESD circuit 45 or driver or receiver circuits or I/O circuits 45' is provided through the layers 64 and 60 of dielectric for external connection. While an ESD circuit 45 is required for all circuits 42 to which an I/O connection is established, the I/O connection can also be provided to a receiver circuit or a driver circuit or an I/O circuit 45'.

The features not previously highlighted that are shown in FIG. 4a are:
the invention provides an interconnect network 72 comprising wide, thick interconnect lines for distribution of the clock and signal stimuli,
the invention creates an interconnect network 72 of thick, wide interconnect lines for the clock and signal stimuli overlying a layer of passivation 62, 70 is an external connection (pad) that is provided for the ESD circuit 45 and for driver/receiver/I/O circuit 45'; pad 70 provides external access for clock and signal stimuli to circuits 45 and 45', and 72 is a clock or signal bus that is created in the dielectric layer 64 using thick, wide wires for interconnect lines; it must be noted that the clock and signal interconnect line distribution 72 is entirely contained within the layer 64 without providing an external point of I/O interconnect.

The method that is used to create the interconnect network that is shown in cross section in FIG. 4a can be summarized as follows. A silicon substrate 40 is provided; active circuits have been created in the surface of the substrate 40 including an ESD circuit 45 and the receiver, driver and I/O circuit 45'. First layers 60 of dielectric of inorganic material are deposited over the substrate 40 and a fine-line interconnect network 61 is created in the layers 60 of dielectric, making contact with the active circuitry 45, 45', and 42. A layer 62 of passivation is deposited over the first thin layers 60 of dielectric; a pattern 63 of metal plugs is created in the layer 62 of passivation (or, for low aspect ratio openings, direct contact is established between overlying layers 72 of metal through an opening in an interposed layer 64 of dielectric); the metal interconnects 67 align with points of electrical contact in the surface of the first layers 60 of dielectric. One or more thicker layers 64 of dielectric are deposited over the surface of the layer 62 of passivation, typically of an organic material; a wide thick line interconnect network 72 is created in the thicker layer 64 of dielectric, making electrical contact with the metal plugs or the metal pads in or under the layer 62 of passivation connected to the receiver, driver or I/O circuit 45'. A point of electrical contact 70 is provided in the surface of the second layer 64 of dielectric and connected to the ESD circuit 45 and the receiver, driver or I/O circuit 45'.

Figure 4B:
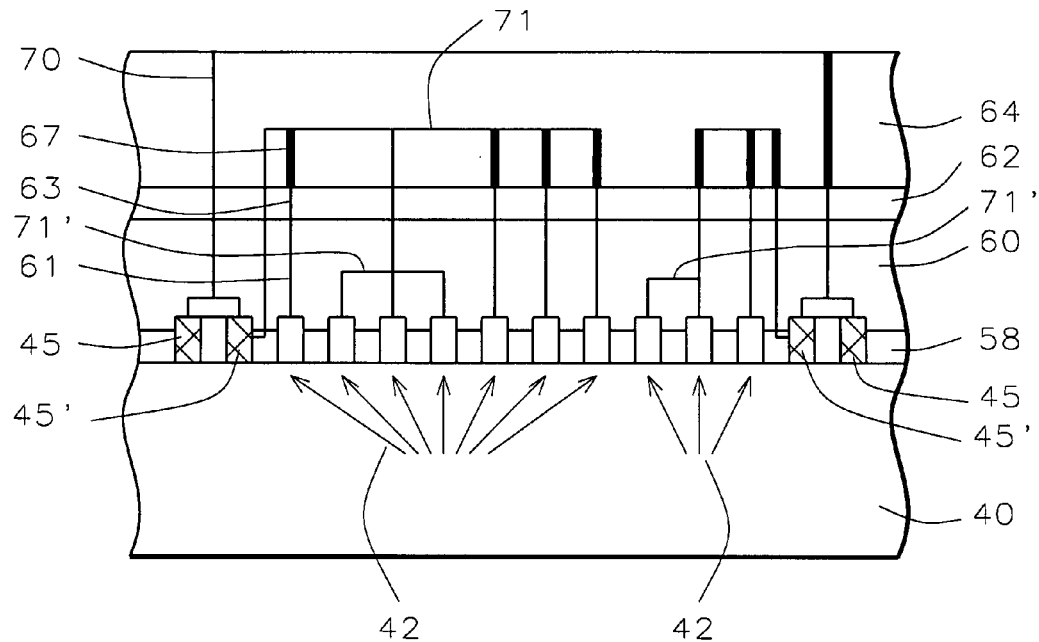
FIG. 4b further distributes signal and clock to the circuit nodes through clock and signal distribution lines that are below a layer of passivation in addition to clock and signal distribution lines that are above a layer of passivation. 71 and 71' each represent one or more than one layer of metal.

FIG. 4b provides further insight into the creation of the signal and clock interconnect lines of the invention whereby these interconnect lines have been shown as interconnect lines 71 and interconnect lines 71'. Interconnect lines 71 have been created above the layer 62 of passivation and act as global signal and clock interconnect lines. Interconnect lines 71' have been created below the layer 62 of passivation and act as local signal and clock interconnect lines. Furthermore, internal circuits 42 have no driver, no receiver, and no ESD connections.

Figure 4C:
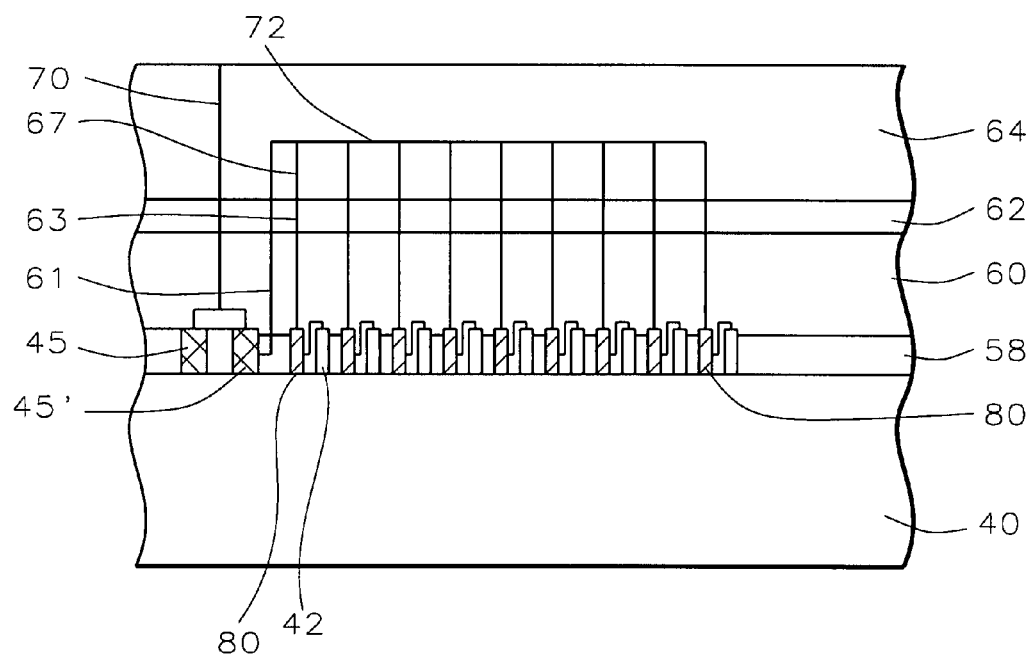
FIGS. 4c and 4d show smaller intra-chip circuit drivers.
Figure 4D:
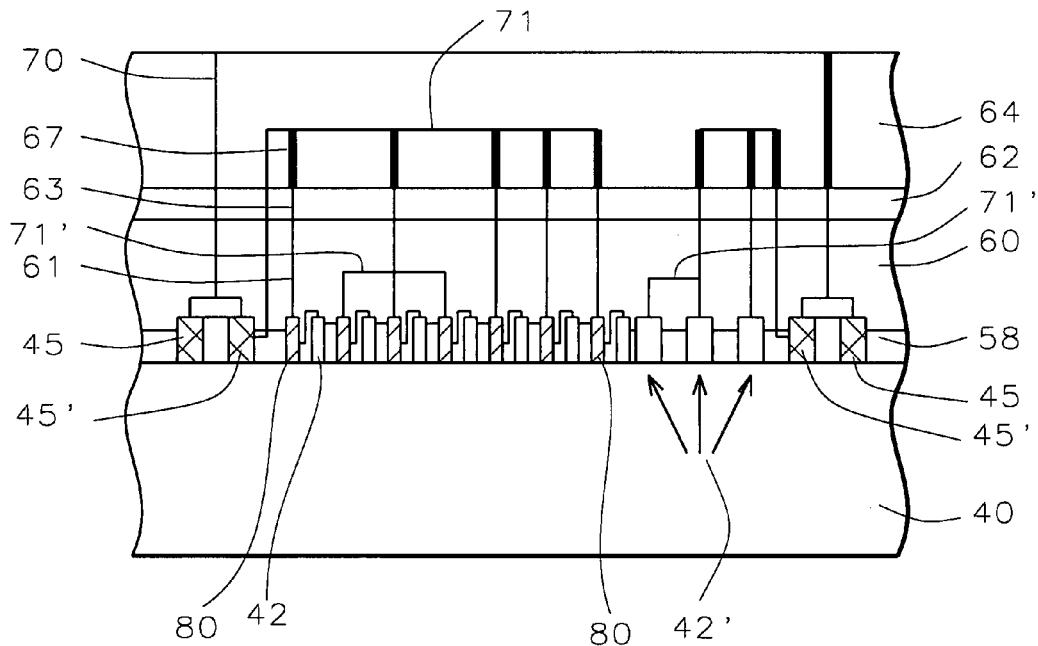

Intra-chip drivers and receivers 80 may be necessary if the interconnection distance is long and/or the load of the net of circuits 42 is large, as shown in FIGS. 4c and 4d. A driver circuit is used to drive a load; i.e., to drive current. A driver current is the output of a driver circuit. The ability to drive current is proportional, in CMOS devices, to the W/L ratio, where W/L is the ratio of the device channel width to its length. These intra-chip drivers 80 are typically smaller than I/O drivers 45'. Intra-chip circuits 80 typically have no ESD circuits and no I/O circuits. For short distance on-chip interconnection, no intra-chip circuits may be required. FIG. 4c shows an interconnecting structure 72 connecting multiple intra-chip drivers or receivers 80, which are connected in series to the internal circuits 42. FIG. 4d shows an example of internal circuits 42 that need to utilize attached intra-chip drivers or receivers while internal circuits 42' do not require attached intra-chip drivers or receivers. Also shown in FIG. 4d is an interconnecting structure 71 connecting multiple intra-chip drivers or receivers 80, which are connected in series to the internal circuits 42.

Further provided are:

45 are two ESD circuits that are provided in or on the surface of the substrate 40, as shown in FIGS. 4a-4d;

ESD circuits are always required for any external connection to an input/output (I/O) pad

45' which are circuits that can be receiver or driver or I/O circuits for input (receiver) or output (driver) or I/O purposes respectively, as shown in FIGS. 4a-4d. These are off-chip drivers or receivers or I/O circuits.

Intra-chip circuits 80 are usually smaller than the off-chip drivers 45'. The intra-chip driver circuits 80 are different from the off-chip circuits 45' in that they have no I/O circuits and no ESD circuits. FIGS. 4c and 4d show smaller internal driver circuits 80 connected to the internal circuits 42. 45' are larger off-chip circuits.

Figure 5A:
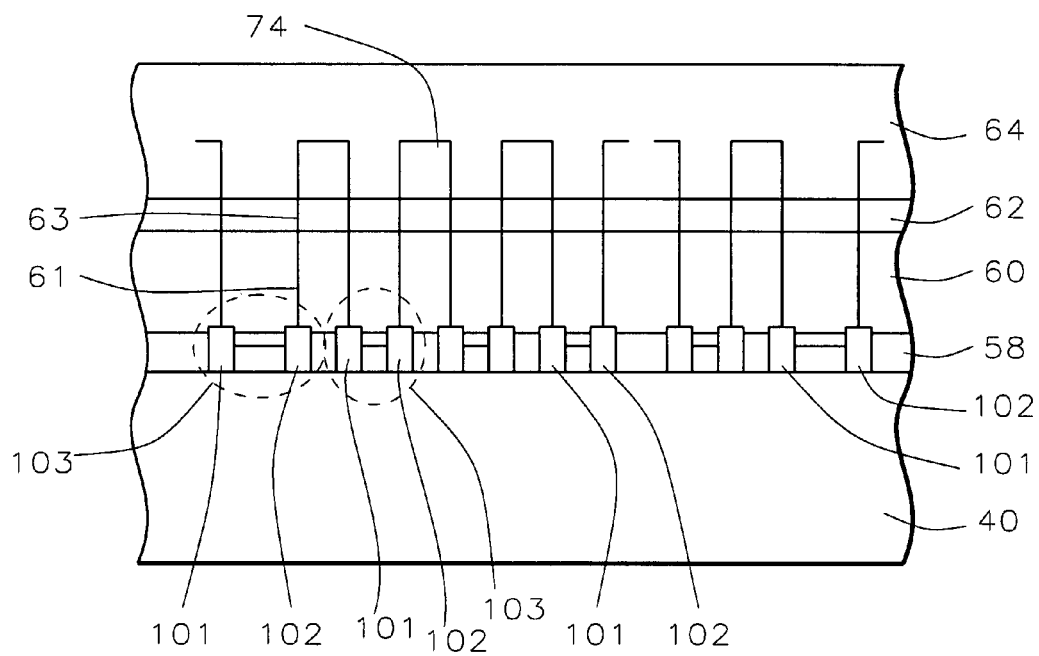
FIG. 5a is a representation of a silicon substrate over which an interconnect network is created according to the invention. No I/O connect pad is provided for external connection in specific networks. The structure that is shown in FIGS. 5a and 5b addresses clock and signal distribution networks of the invention.

FIG. 5a shows a representation of a silicon substrate 40 over which an interconnect network 74 is created according to the invention, with the interconnect network 74 created in a thick layer 64 of dielectric overlying a layer 62 of passivation. No ESD circuit, receiver, driver or I/O circuit access pad is provided for external connection to the internal circuits 42. Shown in FIG. 5a and not previously highlighted is the clock or signal interconnect line 74, providing for an interconnect scheme of thick, wide lines overlying a passivation layer 62 whereby no external I/O connections are provided. Due to the thick, wide lines of the interconnect network 74 that is created overlying a passivation layer 62, the clock and signal distribution can take place entirely within the dielectric layer 64; this as opposed to prior art methods where, for clock and signal distribution lines, each thick, wide interconnect line (where such thick, wide interconnect lines are used) must be provided with at least one I/O connect point for off-chip connection.

The method that is used to create the wide thick line interconnect lines 74 that is shown in cross section in FIG. 5a can be summarized as follows and is similar to that described above for FIG. 4a. A silicon substrate 40 is provided. Active devices have been provided in the surface of the substrate. First thin layers 60 of dielectric are deposited over the surface of the substrate 40, a fine-line interconnect network 61 is created in the first layers 60 of dielectric, comprising fine-line interconnect lines, making contact with points of electrical contact in the surface of the substrate 40. A layer 62 of passivation is deposited over the surface of the first layers 60 of dielectric, a pattern of conductive interconnects 63 is created in the layer 62 of passivation and aligns with the points of electrical contact in the surface of the first layer 60 of dielectric. One or more second layers 65 of dielectric are deposited over the surface of the layer 62 of passivation, the interconnecting structure 74 making electrical contact with the conductive interconnects 63 in the layer 62 of passivation. FIG. 5a shows a series of driver/receivers, or transceivers, or repeater devices 103 each comprising a receiver 101 and a driver 102. Receivers 101 are connected to drivers 102.

Figure 5B:
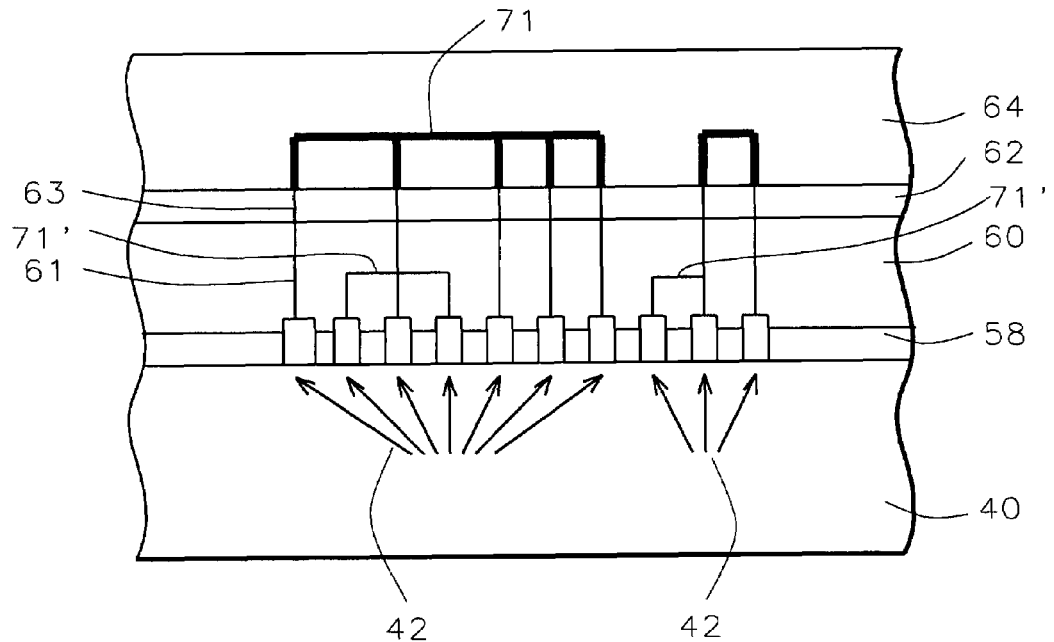
FIG. 5b differentiates between clock and signal distribution lines that are below a layer of passivation and clock and signal distribution lines that are above a layer of passivation.
Figure 5C:
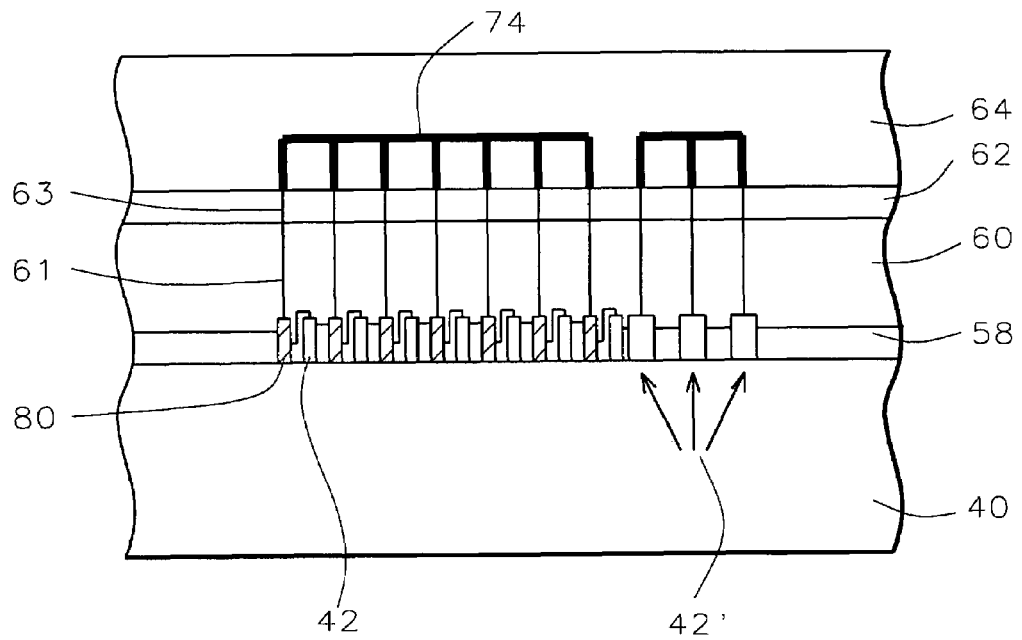
FIGS. 5c and 5d show smaller intra-chip circuit drivers.
Figure 5D:
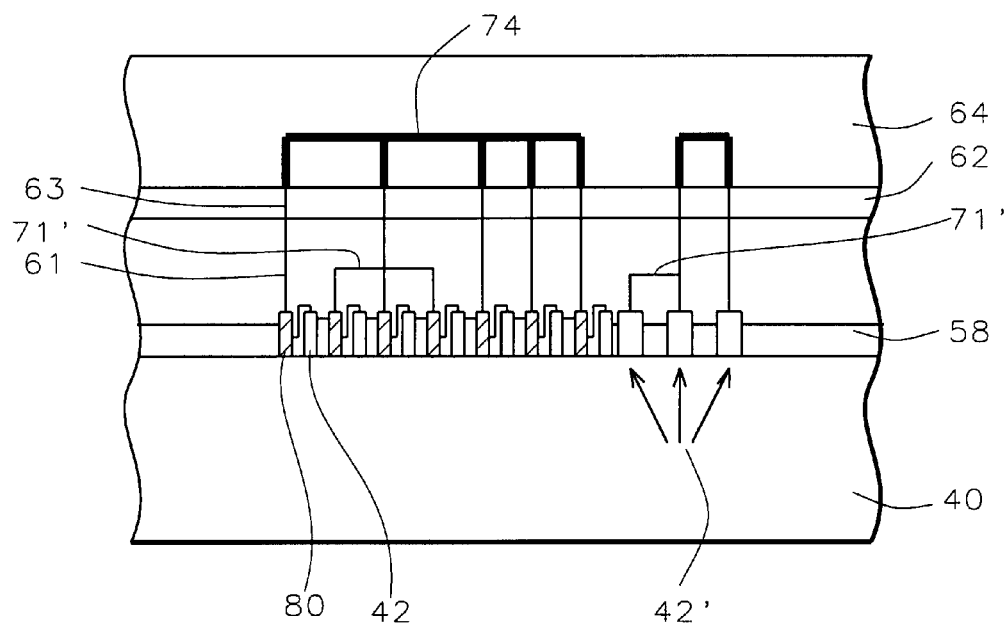

FIG. 5b provides further insight into the creation of the signal and clock interconnect lines of the invention whereby these interconnect lines have been shown as interconnect lines 71 and interconnect lines 71'. Interconnect lines 71 have been created above the layer 62 of passivation and can act as global signal and clock interconnect lines. Interconnect lines 71' have been created below the layer 62 of passivation and act as local signal and clock interconnect lines. Also as shown in FIG. 5b, internal circuits 42 are shown. Circuits 42 have no I/O circuits and no ESD circuits. FIGS. 5c and 5d show smaller internal driver circuits 80 connected to the internal circuits 42. FIGS. 5c and 5d show an interconnecting structure 74 connects multiple intra-chip drivers or receivers 80, which are connected in series to the internal circuits 42.

It must further be emphasized that, where FIGS. 3-5 show a fine-line interconnect network 61 that underlies the layer 62 of passivation, the invention also enables and can be further extended with the complete elimination of the fine-line interconnect network 61 and creating an interconnect network in the dielectric layer 64 that uses only thick, wide wires. For this application of the invention, the first layer of dielectric 60 is not applied, the layer 62 of passivation is deposited directly over the surface of the created semiconductor devices 58 in or on the surface of substrate 40.

It is further of value to briefly discuss the above implemented and addressed distinction between fine-line interconnect lines and wide, thick interconnect lines. The following points apply in this respect:

- the prior art fine line interconnect lines are created underneath a layer of passivation, the wide, thick interconnect lines of the invention are created above a layer of passivation
- the fine-line interconnect lines are typically created in a layer of inorganic dielectric, the thick wide interconnect lines are typically created in a layer of dielectric comprising polymer. This is because an inorganic material cannot be deposited as a thick layer of dielectric because such a layer of dielectric could develop fissures and crack as a result. Although the polymer is preferred, the thick wide interconnect lines could be formed over a conventional passivation layer without the polymer.
- fine-line interconnect metal is typically created using methods of sputter with resist etching or of damascene processes using oxide etch with electroplating after which CMP is applied. Either one of these two approaches cannot create thick metal due to cost considerations or oxide cracking
- thick, wide interconnect lines can be created by first sputtering a thin metal base layer, coating and patterning a thick layer of photoresist, applying a thick layer of metal by electroplating, removing the patterned photoresist and performing metal base etching (of the sputtered thin metal base). This method allows for the creation of a pattern of very thick metal; metal thickness in excess of 1 µm can in this manner be achieved while the thickness of the layer of dielectric in which the thick metal interconnect lines are created can be in excess of 2 µm.

In summary, the post-passivation interconnection of the present invention can connect to three types of circuits (i) off-chip drivers, receivers, I/O circuits, and ESD circuits, (ii) intra-chip drivers and receivers, and (iii) internal circuits. No driver is required for freeway interconnection with a distance<"D". A smaller driver is used for freeway interconnection with a distance>"D"; that is, intra-chip connection. For I/O and ESD circuits, a large driver, larger than the intra-chip driver, is used for off-chip connection.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip structure comprising:
a silicon substrate;
a first repeater in and on said silicon substrate;
a first metallization structure over said silicon substrate, wherein said first metallization structure comprises a first interconnecting structure connected to said first repeater, and wherein said first metallization structure comprises a first metal layer and a second metal layer over said first metal layer;
a dielectric body over said silicon substrate, wherein said first interconnecting structure is in said dielectric body, and wherein said dielectric body comprises a dielectric layer between said first and second metal layers;
a passivation layer over said first metallization structure and over said dielectric body, wherein said passivation layer comprises a nitride layer;
a first via in said passivation layer, wherein said first via is connected to said first interconnecting structure; and
a second metallization structure over said passivation layer and over said first via, wherein said second metallization structure is connected to said first repeater through, in sequence, said first via and said first interconnecting structure.

2. The chip structure of claim 1, wherein said nitride layer has a thickness greater than 0.4 micrometers.

3. The chip structure of claim 1 further comprising a polymer layer between said passivation layer and said second metallization structure, wherein said polymer layer has a thickness between 2 and 150 micrometers.

4. The chip structure of claim 3, wherein said polymer layer comprises polyimide.

5. The chip structure of claim 3 further comprising a polymer layer over said second metallization structure, wherein said polymer layer has a thickness between 2 and 150 micrometers.

6. The chip structure of claim 5, wherein said polymer layer comprises polyimide.

7. The chip structure of claim 1 further comprising a second repeater in and on said silicon substrate and a second via in said passivation layer, wherein said first metallization structure further comprises a second interconnecting structure over said silicon substrate and in said dielectric body, wherein said second interconnecting structure is connected to said second repeater and to said second via, and wherein said first repeater is connected to said second repeater through, in sequence, said first interconnecting structure, said first via, said second metallization structure, said second via and said second interconnecting structure.

8. The chip structure of claim 1, wherein said second metallization structure comprises electroplated copper.

9. The chip structure of claim 1, wherein said second metallization structure comprises electroplated gold.

10. The chip structure of claim 1, wherein said second metallization structure comprises an electroplated metal.

11. The chip structure of claim 1, wherein said first repeater comprises a driver and a receiver connected to said driver.

12. A chip structure comprising:
a silicon substrate;
a first transceiver in and on said silicon substrate;
a first metallization structure over said silicon substrate, wherein said first metallization structure comprises a first interconnecting structure connected to said first transceiver, and wherein said first metallization structure comprises a first metal layer and a second metal layer over said first metal layer;
a dielectric body over said silicon substrate, wherein said first interconnecting structure is in said dielectric body, and wherein said dielectric body comprises a dielectric layer between said first and second metal layers;
a passivation layer over said first metallization structure and over said dielectric body, wherein said passivation layer comprises a nitride layer;

a first via in said passivation layer, wherein said first via is connected to said first interconnecting structure; and a second metallization structure over said passivation layer and over said first via, wherein said second metallization structure is connected to said first transceiver through, in sequence, said first via and said first interconnecting structure.

13. The chip structure of claim 12, wherein said nitride layer has a thickness greater than 0.4 micrometers.

14. The chip structure of claim 12 further comprising a polymer layer between said passivation layer and said second metallization structure, wherein said polymer layer has a thickness between 2 and 150 micrometers.

15. The chip structure of claim 14, wherein said polymer layer comprises polyimide.

16. The chip structure of claim 14 further comprising a polymer layer over said second metallization structure, wherein said polymer layer has a thickness between 2 and 150 micrometers.

17. The chip structure of claim 16, wherein said polymer layer comprises polyimide.

18. The chip structure of claim 12 further comprising a second transceiver in and on said silicon substrate and a second via in said passivation layer, wherein said first metallization structure further comprises a second interconnecting structure over said silicon substrate and in said dielectric body, wherein said second interconnecting structure is connected to said second transceiver and to said second via, and wherein said first transceiver is connected to said second transceiver through, in sequence, said first interconnecting structure, said first via, said second metallization structure, said second via and said second interconnecting structure.

19. The chip structure of claim 12, wherein said second metallization structure comprises electroplated copper.

20. The chip structure of claim 12, wherein said second metallization structure comprises electroplated gold.

21. The chip structure of claim 12, wherein said second metallization structure comprises an electroplated metal.

22. The chip structure of claim 12, wherein said first transceiver comprises a driver and a receiver connected to said driver.

23. The chip structure of claim 3, wherein said polymer layer comprises benzocyclobutene (BCB).

24. The chip structure of claim 5, wherein said polymer layer comprises benzocyclobutene (BCB).

25. The chip structure of claim 14, wherein said polymer layer comprises benzocyclobutene (BCB).

26. The chip structure of claim 16, wherein said polymer layer comprises benzocyclobutene (BCB).

27. The chip structure of claim 1, wherein said passivation layer further comprises an oxide layer.

28. The chip structure of claim 12, wherein said passivation layer further comprises an oxide layer.

* * * * *